United States Patent
Kierey et al.

(10) Patent No.: US 10,578,972 B2
(45) Date of Patent: Mar. 3, 2020

(54) EUV COLLECTOR FOR USE IN AN EUV PROJECTION EXPOSURE APPARATUS

(71) Applicant: Carl Zeiss SMT GmbH, Oberkochen (DE)

(72) Inventors: Holger Kierey, Aalen (DE); Johannes Zellner, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/136,453

(22) Filed: Sep. 20, 2018

(65) Prior Publication Data

US 2019/0033723 A1 Jan. 31, 2019

Related U.S. Application Data

(63) Continuation of application No. PCT/EP2017/057485, filed on Mar. 30, 2017.

(30) Foreign Application Priority Data

Apr. 8, 2016 (DE) .......................... 10 2016 205 893

(51) Int. Cl.
*G03F 7/00* (2006.01)
*G02B 5/08* (2006.01)
(Continued)

(52) U.S. Cl.
CPC ....... *G03F 7/70033* (2013.01); *G02B 5/0891* (2013.01); *G02B 5/1814* (2013.01);
(Continued)

(58) Field of Classification Search
CPC ............. G03B 7/70033; G02B 5/0891; G02B 5/1814; G02B 5/1838; G02B 19/0047; G03F 7/70575
(Continued)

(56) References Cited

U.S. PATENT DOCUMENTS

| | | | |
|---|---|---|---|
| 6,498,685 B1 * | 12/2002 | Johnson | ................ B81C 1/0038 347/241 |
| 7,084,412 B2 | 8/2006 | Weiss | |
| 2005/0094764 A1 * | 5/2005 | Weiss | ..................... B82Y 10/00 378/34 |

(Continued)

FOREIGN PATENT DOCUMENTS

| | | |
|---|---|---|
| DE | 10 2012 202 675 A1 | 1/2013 |
| JP | 2014-236121 A | 12/2014 |
| WO | WO 2016/131069 A2 | 8/2016 |

OTHER PUBLICATIONS

Written Opinion and International Search Report for corresponding PCT Appl No. PCT/EP2017/057485, dated Sep. 1, 2017.
German Office Action, with English translation thereof, for corresponding Appl No. 10 2016 205 893.2, dated Nov. 21, 2016.

*Primary Examiner* — Nicole M Ippolito
(74) *Attorney, Agent, or Firm* — Fish & Richardson P.C.

(57) ABSTRACT

An EUV collector serves for use in an EUV projection exposure apparatus. The collector guides EUV used light emitted by a plasma source region. An overall impingement surface of the collector is impinged upon by radiation emitted by the plasma source region. A used light portion of the overall impingement surface guides the EUV used light. An extraneous light portion of the overall impingement surface is impinged upon by extraneous light radiation, the wavelength of which differs from that of the used light. The used light portion and the extraneous light portion are not congruent. This EUV collector has increased efficiency can involve reduced production costs.

20 Claims, 7 Drawing Sheets

(51) Int. Cl.
  *G02B 5/18* (2006.01)
  *G03F 7/20* (2006.01)
  *G02B 19/00* (2006.01)

(52) U.S. Cl.
  CPC ....... *G02B 5/1838* (2013.01); *G02B 19/0047* (2013.01); *G03F 7/70575* (2013.01)

(58) Field of Classification Search
  USPC ............................... 250/493.1, 494.1, 504 R
  See application file for complete search history.

(56) References Cited

U.S. PATENT DOCUMENTS

| | | | |
|---|---|---|---|
| 2005/0122593 A1* | 6/2005 | Johnson | B82Y 10/00 |
| | | | 359/650 |
| 2006/0039435 A1* | 2/2006 | Cheymol | B82Y 10/00 |
| | | | 372/55 |
| 2009/0289205 A1* | 11/2009 | Moriya | G02B 5/0891 |
| | | | 250/504 R |
| 2010/0231877 A1* | 9/2010 | Wolschrijn | G03F 7/70141 |
| | | | 355/66 |
| 2011/0223543 A1 | 9/2011 | Banine et al. | |
| 2013/0050674 A1* | 2/2013 | Prosyentsov | G03F 9/7015 |
| | | | 355/72 |
| 2013/0335816 A1 | 12/2013 | Kierey et al. | |

\* cited by examiner

EUV COLLECTOR FOR USE IN AN EUV PROJECTION EXPOSURE APPARATUS

CROSS-REFERENCE TO RELATED APPLICATIONS

The present application is a continuation of, and claims benefit under 35 USC 120 to, international application PCT/EP2017/057485, filed Mar. 30, 2017, which claims benefit under 35 USC 119 of German Application No. 10 2016 205 893.2, filed Apr. 8, 2016. The entire disclosure of these applications are incorporated by reference herein.

FIELD

The disclosure relates to an EUV collector for use in an EUV projection exposure apparatus. Further, the disclosure relates to an illumination system including such a collector, an optical system including such an illumination system, a projection exposure apparatus including such an optical system, a method for producing a microstructured or nanostructured component and a microstructured or nanostructured component produced by this method.

BACKGROUND

An EUV collector is known from US 2013/0335816 A1 and U.S. Pat. No. 7,084,412 B2.

SUMMARY

The present disclosure seeks to develop an EUV collector with improved efficiency. Moreover, where possible, the production costs for the EUV collector should be reduced compared to the prior art.

In one aspect, the disclosure provides an EUV collector for use in an EUV projection exposure apparatus. The collector is embodied to guide EUV used light, which is emitted by a plasma source region. An overall impingement surface of the collector is embodied for impingement with radiation emitted by the plasma source region. A used light portion of the overall impingement surface is embodied to guide the EUV used light. An extraneous light portion of the overall impingement surface is embodied to divert extraneous light radiation, the wavelength of which differs from that of the used light. The used light portion and the extraneous light portion are not congruent. The extraneous light portion is embodied as a diffraction grating for the extraneous light radiation.

The extraneous light radiation may be pump light reflected by the plasma source region, the pump light serving to generate a plasma in the plasma source region. In particular, the extraneous light radiation relates to radiation components of the pump light. According to the disclosure, it has been identified that it is not necessary to design an entire used light portion of the overall impingement surface of the collector to also suppress extraneous light. In particular, it is not necessary to provide an entire collector surface with a diffraction grating for extraneous light suppression. Instead, it is sufficient to embody an extraneous light portion of the overall impingement surface, which is not embodied congruent with the used light portion and which has the purpose of diverting extraneous light radiation and, in particular, of being impinged upon by extraneous light radiation. This increases a collector efficiency and, in particular, a used light throughput which may be obtained by the collector. This increased used light throughput may be obtained without an unwanted reduction of an extraneous light suppression by the collector. It is possible to avoid unwanted losses in the used light throughput, which emerge on account of imperfections of an extraneous light suppression by way of a diffraction grating embodied completely over the collector surface. The production costs of the EUV collector may also be reduced by virtue of not the entire used light portion of the overall impingement surface of the collector also being designed for extraneous light suppression. The diversion of the extraneous light portion may be carried out by guiding the extraneous light to an extraneous light trap, by guiding the extraneous light to a different extraneous light use and by absorbing or dissipating the extraneous light. The extraneous light portion embodied as diffraction grating for the extraneous light radiation may be embodied as a laminar grating. The diffraction grating may be embodied as a blazed grating. The diffraction grating may be produced by material-ablating processing or by etching, in particular by mask etching. A diffraction efficiency of the diffraction grating may be very low in the zero order. A suppression of the diffraction grating, i.e. a ratio between a diffraction efficiency in the zero order and a diffraction efficiency in higher orders, may be less than $1/100$ and, in particular, may be $1/1000$.

The extraneous light portion can have an extent which is at most 50% of the used light portion. Such an extent ratio according ensures a particularly high collector efficiency. An extent ratio between the extraneous light portion and the used light portion may be at most 25%, may be at most 20%, may be at most 15% and may also be even smaller.

The extraneous light portion can constitute a sub-portion of the used light portion. Such an extraneous light portion embodied as a sub-portion of the used light portion constitutes a sub-portion of the overall impingement surface and, at the same time, serves to guide the EUV used light and to be impinged upon by extraneous light radiation. Then, the remaining overall impingement surface outside of the extraneous light portion, in particular, is embodied exclusively to guide the EUV used light and may have a particularly high reflection efficiency there.

The used light portion can be configured so that the EUV used light guided therewith is not reflected more than once at the location. In such a configuration of the collector, reflection losses of the EUV used light are minimized.

The extraneous light portion can constitute a portion of the overall impingement surface which is separate from the used light portion. In such a configuration, the extraneous light portion is not used to guide the EUV used light. There is no need to consider a reflection efficiency for the used light there, which reduces the production costs. In particular, there is no need for a reflection grating at the location of the extraneous light portion.

The extraneous light portion may be embodied as an opening in the used light portion. Such an embodiment of the extraneous light portion as opening in the used light portion leads to a particularly cost-effective collector. The extraneous light portion may then constitute a passage opening for the extraneous light radiation. The extraneous light radiation may then be diverted after passage through this passage opening by way of an extraneous light trap.

The used light portion may be distributed among at least two separate collector components, with the extraneous light portion being embodied as interstice between the at least two collector components. Such an extraneous light portion embodied as interstice between at least two collector components increases the design options when designing the collector.

The extraneous light portion can be a portion of the overall impingement surface which absorbs the extraneous light. Such an embodiment can lead to a collector which is producible in a cost-effective manner. The extraneous light portion may also be realized by a stop on the overall impingement surface or by an extraneous light scattering portion on the overall impingement surface or by an extraneous light reflection portion on the overall impingement surface.

At least one region of the used light portion can be embodied for incidence of the EUV used light with an angle of incidence of at most 45°. Such an embodiment of the used light portion leads to a collector which is producible in a comparatively cost-effective manner and which is also referred to as normal incidence (NI) collector. Overall, the collector may be embodied as an NI collector. Alternatively, it is possible to design at least one sub-unit of the collector as an NI unit, wherein at least one further sub-unit is then also embodied as a sub-unit for the incidence of the EUV used light with an angle of incidence greater than 45° (grazing incidence impingement; GI unit).

A pump light passage opening can be present for the passage of incident pump light from a pump light source. Such a pump light passage opening simplifies pump light coupling into the plasma source region. The pump light passage opening may be embodied within an extraneous light portion embodied as an opening in the used light portion and may then e.g. form part of an extraneous light passage opening.

The extraneous light portion can be arranged in the region of a pump light impact zone of the overall impingement surface, wherein the pump light impact zone is the zone into which pump light is reflected during the operation of the EUV collector from a plasma generation material arranged in a plasma source region. Such an arrangement leads to particularly efficient arrangement since extraneous light is diverted where it mainly is incident on the EUV collector during the operation thereof.

To the extent that the overall impingement surface or the used light portion of the collector has a rotationally symmetric embodiment in respect of an axis of symmetry, the extraneous light portion may be arranged in a non-rotationally symmetric manner in relation to this axis of symmetry. A centroid of the extraneous light portion may then have a lateral offset in relation to an intersection point of the axis of symmetry with the overall impingement surface or the used light portion.

The extraneous light portion can completely cover the pump light impact zone. Such an arrangement provides an efficient extraneous light diversion.

Corresponding advantages are present for an illumination system including a collector disclosed herein, an optical system including such an illumination system and a projection optical unit, a projection exposure apparatus including such an optical system and an EUV light source, a production method using such a projection exposure apparatus, and a microstructured or nanostructured component made by such a method.

In particular, a semiconductor component, for example a memory chip, may be produced using the projection exposure apparatus.

BRIEF DESCRIPTION OF THE DRAWINGS

Exemplary embodiments of the disclosure are explained in more detail below on the basis of the drawing. In detail.

DETAILED DESCRIPTION

Figure 1:
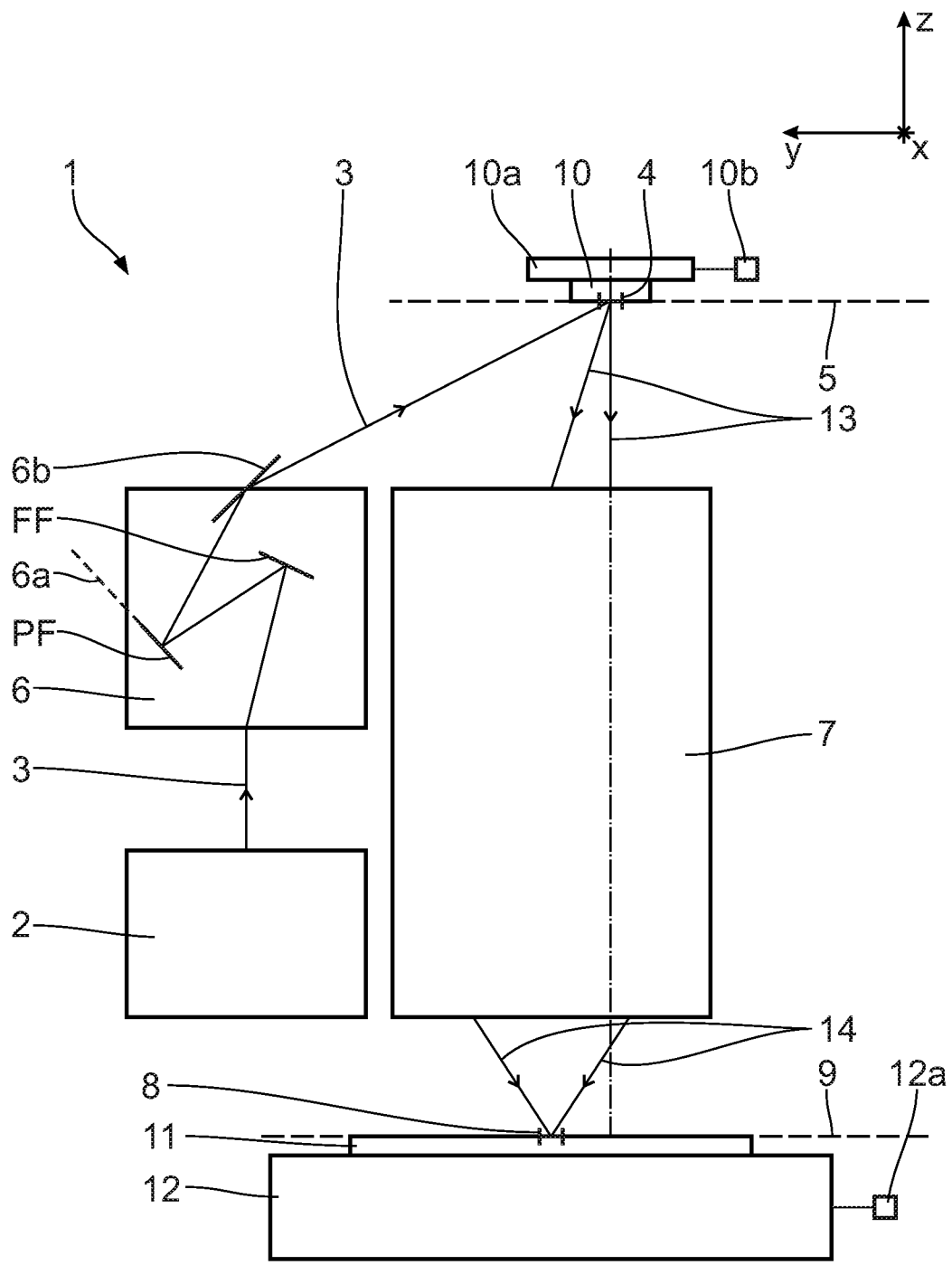
FIG. 1 schematically shows a projection exposure apparatus for EUV microlithography.

A projection exposure apparatus 1 for microlithography includes a light source 2 for illumination light and/or imaging light 3, which will be explained in yet more detail below. The light source 2 is an EUV light source, which produces light in a wavelength range of e.g. between 5 nm and 30 nm, in particular between 5 nm and 15 nm. The illumination light and/or imaging light 3 is also referred to as EUV used light below.

In particular, the light source 2 may be a light source with a wavelength of 13.5 nm or a light source with a wavelength of 6.9 nm. Other EUV wavelengths are also possible. A beam path of the illumination light 3 is depicted very schematically in FIG. 1.

An illumination optical unit 6 serves to guide the illumination light 3 from the light source 2 to an object field 4 in an object plane 5. The illumination optical unit includes a field facet mirror FF depicted very schematically in FIG. 1 and a pupil facet mirror PF disposed downstream in the beam path of the illumination light 3 and likewise depicted very schematically. A field-forming mirror 6b for grazing incidence (GI mirror; grazing incidence mirror) is arranged in the beam path of the illumination light 3 between the pupil facet mirror PF, which is arranged in a pupil plane 6a of the illumination optical unit, and the object field 4. Such a GI mirror 6b is not mandatory.

Pupil facets (not depicted in any more detail) of the pupil facet mirror PF are part of a transfer optical unit, which transfer, and in particular image, field facets (likewise not depicted) of the field facet mirror FF into the object field 4 in a manner superposed on one another. An embodiment known from the prior art may be used for the field facet mirror FF on the one hand and the pupil facet mirror PF on the other hand. By way of example, such an illumination optical unit is known from DE 10 2009 045 096 A1.

Using a projection optical unit or imaging optical unit 7, the object field 4 is imaged into an image field 8 in an image plane 9 with a predetermined reduction scale. Projection optical units which may be used to this end are known from e.g. DE 10 2012 202 675 A1.

In order to facilitate the description of the projection exposure apparatus 1 and the various embodiments of the projection optical unit 7, a Cartesian xyz-coordinate system is indicated in the drawing, from which system the respective positional relationship of the components illustrated in the figures is evident. In FIG. 1, the x-direction runs perpendicular to the plane of the drawing into the latter. The y-direction extends to the left in FIG. 1 and the z-direction extends upward in FIG. 1. The object plane 5 extends parallel to the xy-plane.

The object field 4 and the image field 8 are rectangular. Alternatively, it is also possible for the object field 4 and the image field 8 to have a bent or curved embodiment, that is to say, in particular, a partial ring shape. The object field 4 and the image field 8 have an x/y-aspect ratio of greater than 1 Therefore, the object field 4 has a longer object field dimension in the x-direction and a shorter object field dimension in the y-direction. These object field dimensions extend along the field coordinates x and y.

One of the exemplary embodiments known from the prior art may be used for the projection optical unit 7. What is imaged in this case is a section of a reflection mask 10, also referred to as reticle, coinciding with the object field 4. The reticle 10 is carried by a reticle holder 10a. The reticle holder 10a is displaced by a reticle displacement drive 10b.

The imaging by way of the projection optical unit 7 is implemented on the surface of a substrate 11 in the form of a wafer, which is carried by a substrate holder 12. The substrate holder 12 is displaced by a wafer or substrate displacement drive 12a.

FIG. 1 schematically illustrates, between the reticle 10 and the projection optical unit 7, a ray beam 13 of the illumination light 3 that enters into the projection optical unit and, between the projection optical unit 7 and the substrate 11, a ray beam 14 of the illumination light 3 that emerges from the projection optical unit 7. An image field-side numerical aperture (NA) of the projection optical unit 7 is not reproduced to scale in FIG. 1.

The projection exposure apparatus 1 is of the scanner type. Both the reticle 10 and the substrate 11 are scanned in the y-direction during the operation of the projection exposure apparatus 1. A stepper type of the projection exposure apparatus 1, in which a stepwise displacement of the reticle 10 and of the substrate 11 in the y-direction is effected between individual exposures of the substrate 11, is also possible. These displacements are effected synchronously to one another by an appropriate actuation of the displacement drives 10b and 12a.

Figure 2:
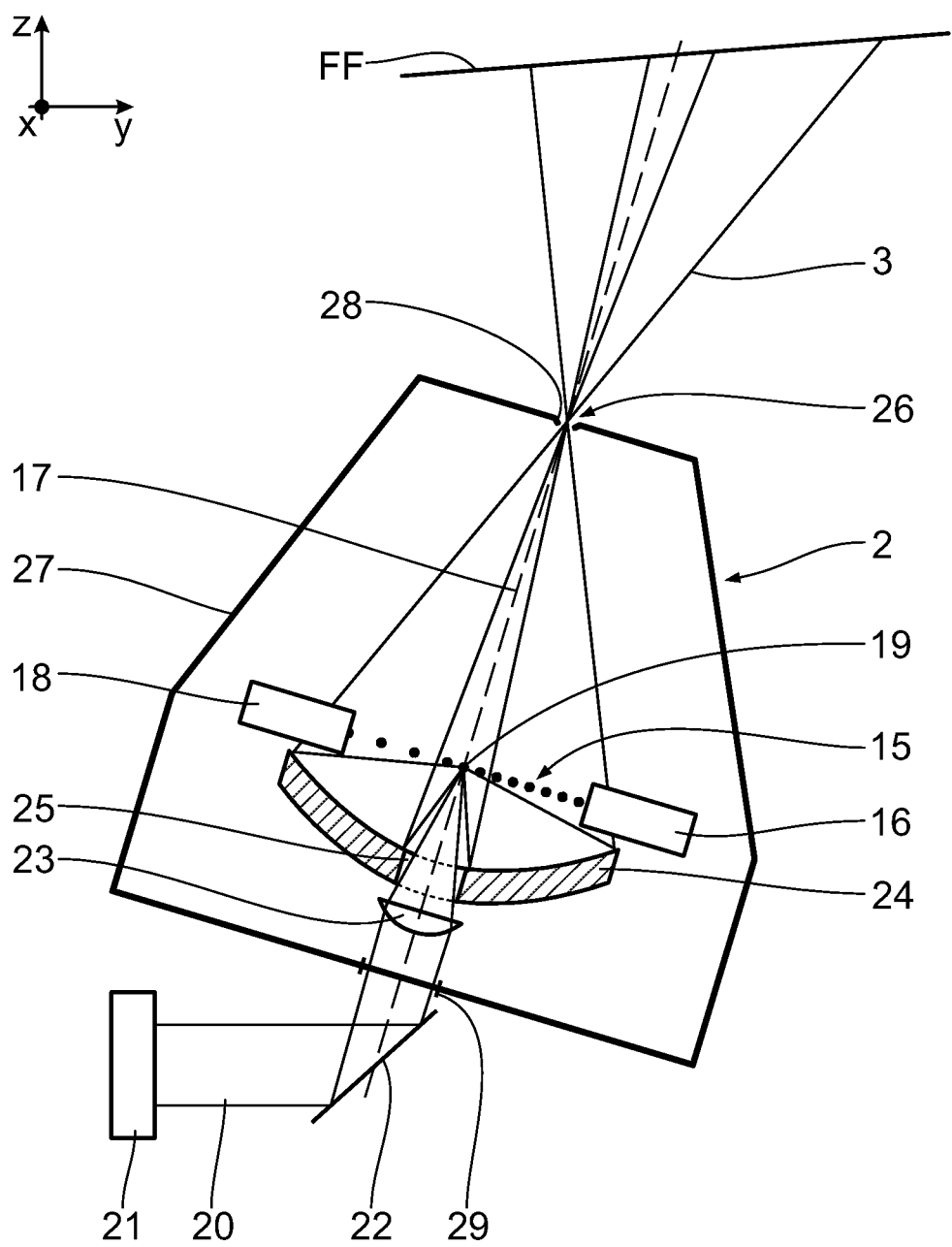
FIG. 2 shows details of a light source of the projection exposure apparatus in the surroundings of an EUV collector for guiding EUV used light from a plasma source region to a field facet mirror of an illumination optical unit of the projection exposure apparatus, with the EUV collector being depicted in a meridional section.

FIG. 2 shows details of the light source 2.

The light source 2 is an LPP (laser produced plasma) source. For the purposes of producing plasma, tin droplets 15 are generated as a continuous droplet sequence by a tin droplet generator 16. A trajectory of the tin droplets 15 extends transversely to a main beam direction 17 of the EUV used light 3. Here, the tin droplets 15 drop freely between the tin droplet generator 16 and a tin capturing device 18, with the droplets passing through a plasma source region 19. The EUV used light 3 is emitted by the plasma source region 19. When the tin droplet 15 arrives in the plasma source region 19, it is impinged upon there by pump light 20 from a pump light source 21. The pump light source 21 may be an infrared laser source in the form of e.g. a $CO_2$ laser. A different IR laser source is also possible, in particular a solid-state laser, for example an Nd:YAG laser.

The pump light 20 is transferred into the plasma source region 19 by way of a mirror 22, which may be a mirror that is tiltable in a controllable fashion, and by way of a focusing lens 23. A plasma emitting the EUV used light 3 is generated by the pump light impingement from the tin droplet 15 arriving in the plasma source region 19. A beam path of the EUV used light 3 is depicted in FIG. 2 between the plasma source region 19 and the field facet mirror FF, to the extent that the EUV used light is reflected by a collector mirror 24, which is also referred to as EUV collector 24 below. The EUV collector 24 includes a central passage opening 25 for the pump light 20 focussed towards the plasma source region 19 by way of the focusing lens 23. The collector 24 is embodied as an ellipsoid mirror and transfers the EUV used light 3 emitted by the plasma source region 19, which is arranged in an ellipsoid focus, to an intermediate focus 26 of the EUV used light 3, which is arranged in the other ellipsoid focus of the collector 24.

The field facet mirror FF is disposed downstream of the intermediate focus 26 in the beam path of the EUV used light 3, in the region of a far field of the EUV used light 3.

The EUV collector 24 and further components of the light source 2, which may be the tin droplet generator 16, the tin capturing device 18 and the focusing lens 23, are arranged in a vacuum housing 27. The vacuum housing 27 includes a passage opening 28 in the region of the intermediate focus 26. In the region of an entrance of the pump light 20 into the vacuum housing 27, the latter includes a pump light entrance window 29.

Figure 3:
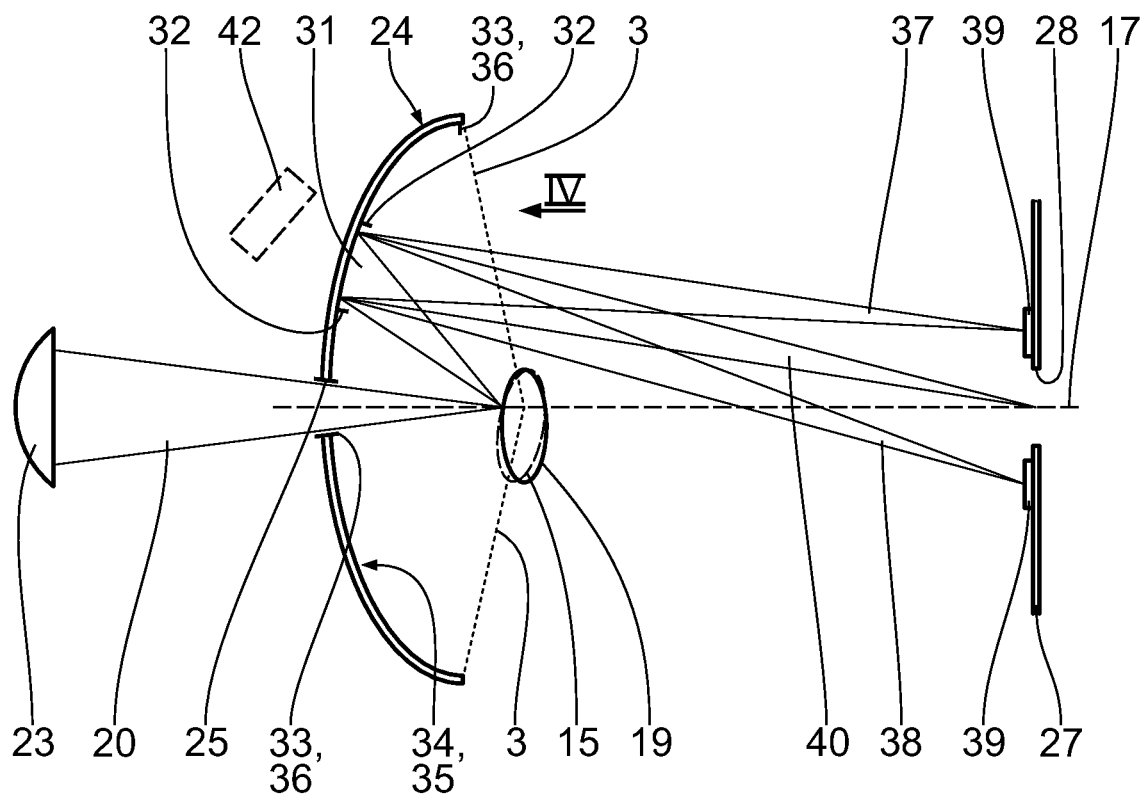
FIG. 3 schematically shows beam guiding of pump light from a pump light source of the EUV light source of the projection exposure apparatus.

FIG. 3 shows a beam path of the pump light 20 between the focusing lens 23 and the passage opening 28 in the vacuum housing 27 only partly depicted in FIG. 3. The pump light 20 focussed by the focusing lens 23 is partly reflected in the plasma source region 19 in the form of a pump light component 31 by the tin droplet 15 entering into this plasma source region 19 and, possibly, by already created plasma. This tin droplet 15 is present in a form which does not reflect the pump light component 31 reflected by the tin droplet back into itself. The reflected pump light component 31 leaves the tin droplet with an angle of reflection which may lie in the range between 5° and 35° and which is approximately 20° in the exemplary embodiment depicted in FIG. 3. The pump light component 31 reflected by the tin droplet 15 is incident on the EUV collector 24 in a pump light impact zone 32 which is decentred in relation to the pump light passage opening 25. An optical diffraction grating 33 for the pump light 20 is applied to the EUV collector 24 in a manner completely covering the pump light impact zone 32.

Thus, an overall impingement surface 34 of the collector 24, which is embodied for impingement with radiation emitted by the plasma source region 19, includes a used light portion 35 on the one hand and an extraneous light portion 36 on the other hand. The used light portion 35 of the overall impingement surface 34 of the collector 24 is embodied to guide the EUV used light 3 and coincides with the overall impingement surface 34 of the collector 24 in the embodiment according to FIG. 4. The extraneous light portion 36 of the overall impingement surface 34 is embodied for impingement with extraneous light radiation, i.e. for impingement with radiation, in particular having the wavelength of the pump light 20, which differs from the wavelength of the EUV used light 3. The pump light component 31 is an example of this extraneous light radiation. In the embodiment according to FIG. 4, the extraneous light portion 36 coincides with the extent of the diffraction grating 33.

The used light portion 35 and the extraneous light portion 36 are not congruent since the extraneous light portion 36 only covers part of the used light portion 35. The extraneous light portion 36 has an area of extent which is at most 50% of the area of extent of the used light portion 35. This ratio of extent may also be smaller and, for example, be 25% or 10%.

Figure 4:
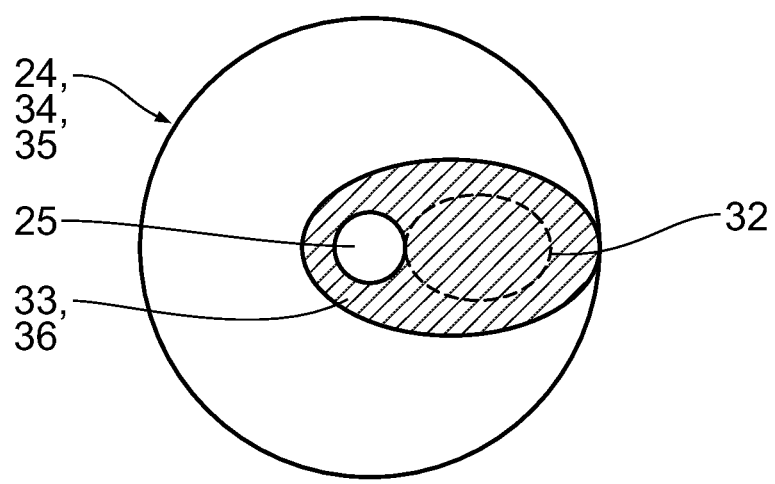
FIG. 4 shows a plan view of the EUV collector, as seen from the direction of view IV in FIG. 3.

In the embodiment of the collector 24 according to FIG. 4, the extraneous light portion 36, i.e. an edge contour of the diffraction grating 33, has an elliptic embodiment and covers the pump light passage opening 25 over the entire circumference thereof and, at the other end, extends up to the edge of the overall impingement surface 34. A different course of the edge contour of the diffraction grating 33 is also possible, in particular as is still to be explained in conjunction with the following collector embodiments.

Outside of the region of the diffraction grating 33, i.e. outside of the extraneous light portion 36, the overall impingement surface 34 is embodied without diffraction grating and, in particular, as an unstructured reflection surface for the EUV used light.

The diffraction grating 33 is embodied as a laminar grating, i.e. as a grating with a right-angled profile structure, with profile troughs having the same extent as profile peaks. As an alternative to the design as a laminar grating, the diffraction grating 33 may also be embodied as a blazed grating, but this is not depicted in the drawing.

The function of the diffraction grating 33 is indicated in FIG. 3. The pump light component 31 reflected by the tin droplet 15 is diffracted by the diffraction grating 33. FIG. 3 depicts the beam path of a +1st order 37 of the diffracted pump light and a −1st order 38 of the defracted pump light component 31. These diffracted pump light components 37, 38 do not pass through the used light passage opening 28 but are diverted as extraneous light and absorbed by absorber structures 39 attached in the vacuum housing 27. Alternatively, pump light exit openings may also be attached to the vacuum housing 27 in the region of the absorber structure 39, with the diffracted pump light components 37, 38 then being diverted in a targeted fashion after exit according to these pump light exit windows.

Additionally, FIG. 3 also schematically depicts the beam path of a 0th order of diffraction 40. The diffraction efficiency of the diffraction grating 33 at this 0th order of diffraction 40 is lower by several orders of magnitude than the diffraction efficiency in the +/−1st orders 37, 38. Here, a suppression ratio may lie at ¹⁄₁₀₀ up to ¹⁄₁₀₀₀. Thus, the diffracted pump light component passing through the used light passage opening 28 is negligibly small.

The pump light 20, which has a wavelength which differs from that of the EUV pump light, is subsequently also referred to as extraneous light. Other radiation, the wavelength of which differs from the pump light wavelength and, at the same time, from the used light wavelength, may also constitute extraneous light which is suppressed via the collector 24.

The diffraction grating 33 may be produced with the aid of material-ablating processing or by an etching method, in particular by mask etching. The material-ablating method may be a turning method, in which a cutting tool is brought into engagement with the collector workpiece in the region of the diffraction grating 33 in a manner which is controlled and synchronized to the rotation of the workpiece, and otherwise disengaged again.

Lithographic methods or laser material processing by direct writing of the diffraction pattern using a material processing laser are further possible methods for producing the diffraction grating 33. The lithographic methods may also include local moulding of a master structure by direct bringing into contact with the collector main body at the location of the diffraction grating 33.

In the embodiment according to FIG. 4, the extraneous light portion 36 constitutes a sub-portion of the used light portion 35. Therefore, this sub-portion of the overall impingement surface 34 serves simultaneously to guide the EUV used light 3 and to be impinged upon by the pump light component 31, i.e. by the extraneous light radiation. The remaining overall impingement surface 34 is embodied exclusively to guide the EUV used light. This avoids used light reflection losses on account of, in particular, an imperfection of the diffraction grating 33.

The collector 24 is embodied as a mirror for substantially perpendicular incidence (normal incidence mirror; NI mirror) of the EUV used light 3. Thus, the used light portion 35 is embodied for incidence of the EUV used light 3 with an angle of incidence of at most 45°.

With the illumination optical unit 6, the collector 24 constitutes an illumination system of the projection exposure apparatus. Together with the projection optical unit 7, the illumination system constitutes an optical system of the projection exposure apparatus 1.

A further embodiment for the EUV collector 24, which may be used instead of the embodiment described above, is explained in the following text on the basis of FIG. 5. Components and functions corresponding to those which were used above with reference to the embodiment according to FIGS. 1 to 4 have the same reference signs and are not discussed again in detail.

Figure 5:
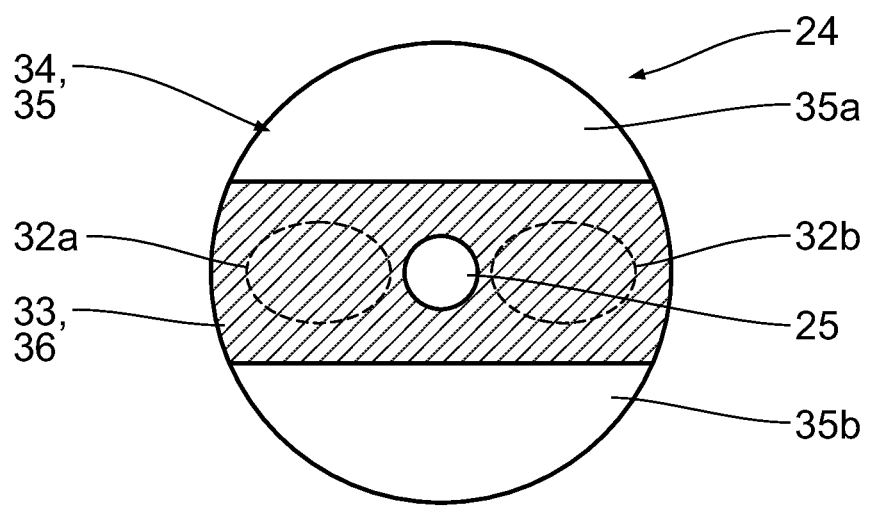
FIG. 5 shows, in an illustration similar to FIG. 4, a further embodiment of an EUV collector.

In the EUV collector 24 according to FIG. 5, the extraneous light portion 36 is likewise present as a diffraction grating 33 in the form of a central stripe portion of the collector 24 which is round overall. In addition to this stripe-shaped diffraction grating 33, the used light portion 35 also includes an upper segment-shaped used light region 35a and a lower, likewise segment-shaped used light region 35b.

The stripe-shaped extraneous light portion 36 covers possible extraneous light impact zones which are indicated in a dashed fashion at 32a and 32b in FIG. 5.

A further embodiment for the EUV collector 24, which may be used instead of the embodiment described above, is explained in the following text on the basis of FIG. 6. Components and functions corresponding to those which were used above with reference to the embodiment according to FIGS. 1 to 5 have the same reference signs and are not discussed again in detail.

Figure 6:
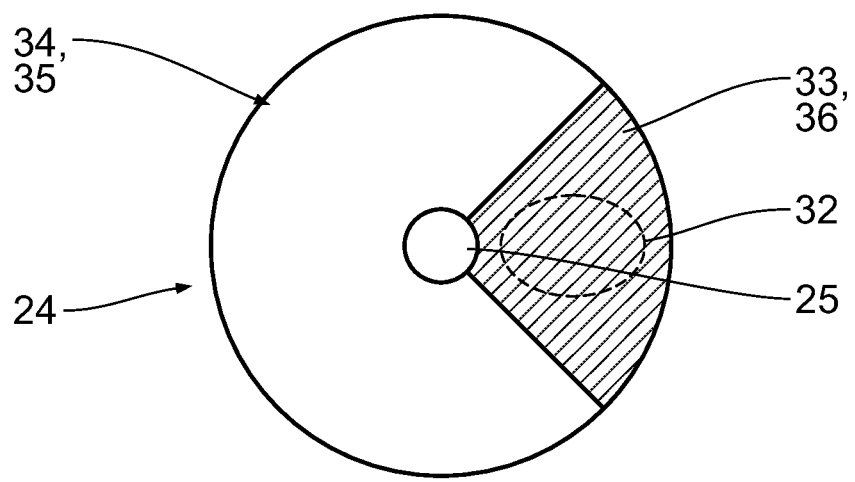
FIG. 6 shows, in an illustration similar to FIG. 4, a further embodiment of an EUV collector.

In the EUV collector 24 according to FIG. 6, the extraneous light portion 36, once again embodied as a laminar diffraction grating 33, has a sector-shaped embodiment and covers a quarter of the overall impingement surface 34, i.e. an azimuth angle of 90°.

Below, three further exemplary embodiments of EUV collectors 24, which are alternatives to one another in each case, are described on the basis of FIGS. 7 to 9; the exemplary embodiments may be used in place of the EUV collector according to FIGS. 4 to 6. Components and functions corresponding to those which were used above with reference to the embodiment according to FIGS. 1 to 6 have the same reference signs and are not discussed again in detail.

Figure 7:
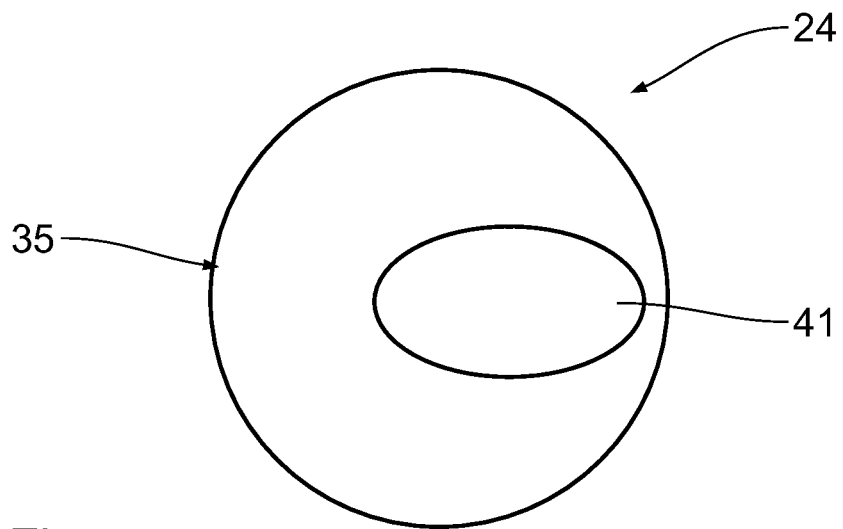
FIGS. 7 to 9 show, in illustrations similar to FIGS. 4 to 6, further embodiments of an EUV collector.
Figure 8:
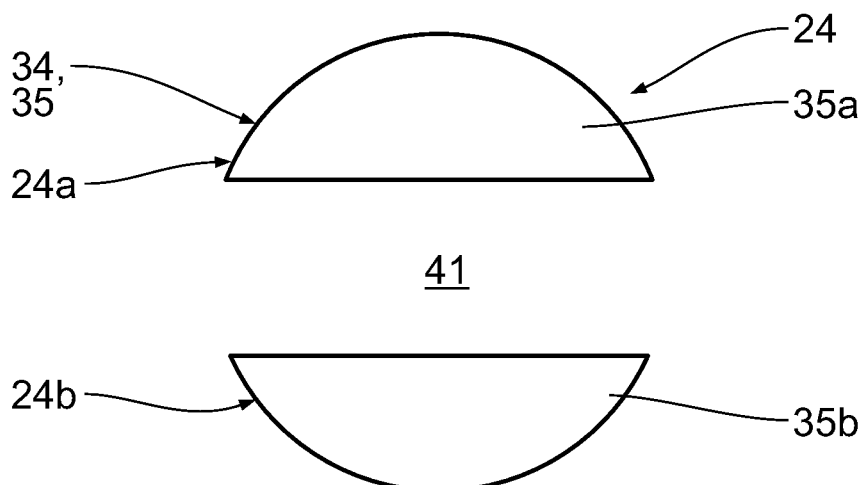
Figure 9:
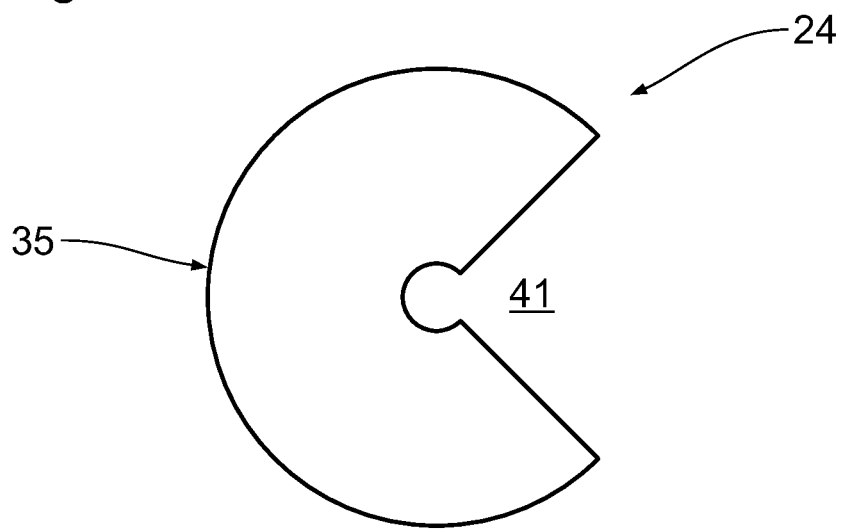

In the EUV collector variants according to FIGS. 7 to 9, the respective extraneous light portion 41 constitutes a portion of an overall impingement surface 34 of the collector 24 which is separate from the used light portion 35 in each case. In the case of the EUV collectors 24 according to FIGS. 7 to 9, the extraneous light portion 41 is not used to guide the EUV used light 3 in each case. In the EUV collector 24 according to FIG. 7, the extraneous light portion 41 is embodied as an opening in the used light portion 35. In this embodiment, the extraneous light portion 41 constitutes a passage opening for the pump light component 31, i.e. for the extraneous light radiation. The pump light component 31 may then be diverted or dissipated by way of an extraneous light trap (cf. the extraneous light trap 42 in FIG. 3 indicated by dashed lines) arranged downstream of the EUV collector 24.

This passage opening of the extraneous light portion 41 according to FIG. 7 has an elliptic inner contour which corresponds to the elliptic edge contour of the diffraction grating 33 of the extraneous light portion 36 of the EUV collector 24 according to FIG. 4.

In the embodiment of the EUV collector according to FIG. 8, the used light portion 35 is distributed among two separate collector components 24a, 24b, which each have a segment form and, in respect of the arrangement thereof, correspond to the used light portions 35a, 35b of the EUV collector 24 according to FIG. 5.

In the EUV collector 24 according to FIG. 9, the extraneous light portion 36 is embodied as a circular-sector-shaped cut-out in the otherwise round EUV collector 24. The arrangement and the extent of the extraneous light portion 41 according to FIG. 9 corresponds to that of the extraneous light portion according to FIG. 6.

Figure 10:
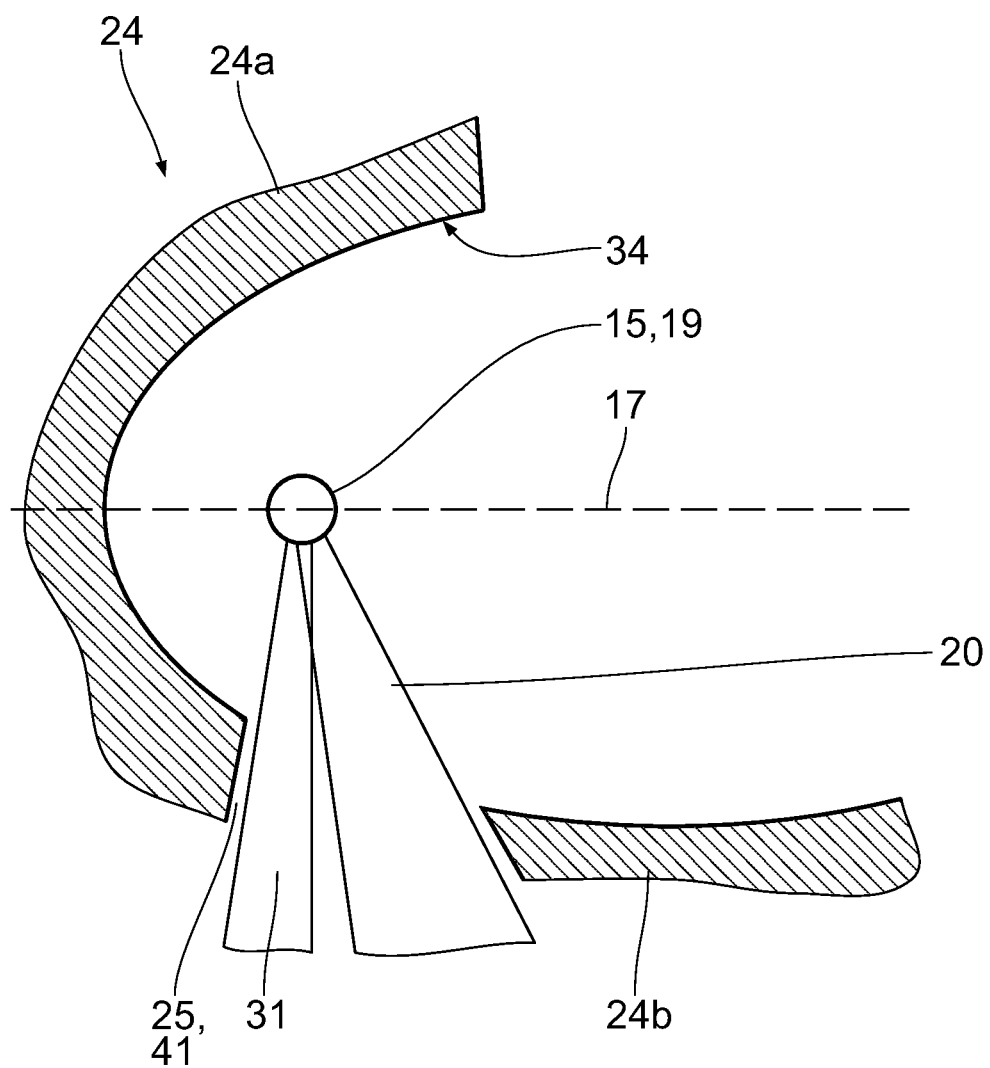
FIG. 10 shows, in a meridional section, a further embodiment of an EUV collector including two separate collector components, with beam guiding for the pump light additionally being depicted.

In an illustration similar to FIG. 3, FIG. 10 shows a further embodiment of an EUV collector 24 which includes two collector components 24a and 24b which, together, form an ellipsoid mirror. Components and functions corresponding to those which were used above with reference to the embodiment according to FIGS. 1 to 9 have the same reference signs and are not discussed again in detail.

The tin droplet 15 which has entered into the plasma source region 19 is depicted in the focus closer to the mirror surface. In a manner comparable to the embodiment according to FIG. 8, the extraneous light portion 41 is also embodied as an interstice between the two collector components 24a and 24b in the case of the EUV collector 24 according to FIG. 10.

In the case of the EUV collector 24 according to FIG. 10, the pump light 20 is radiated inwards in such a way relative to the chief ray direction 17 of the EUV collector 24, i.e. a connecting line between the plasma source region 19 and the intermediate focus 26, that an angle bisector between the incident pump light 20 and the pump light component 31 reflected by the tin droplet 15 includes an angle with the chief ray direction 17 that is greater than 70°.

The collector components 24a, 24b have such an embodiment that, together, they cover a large solid angle range around the plasma source region 19, in particular a solid angle range which is greater than $\pi$, which is greater than $2\pi$ and which may also be greater than $2.5\pi$.

Figure 11:
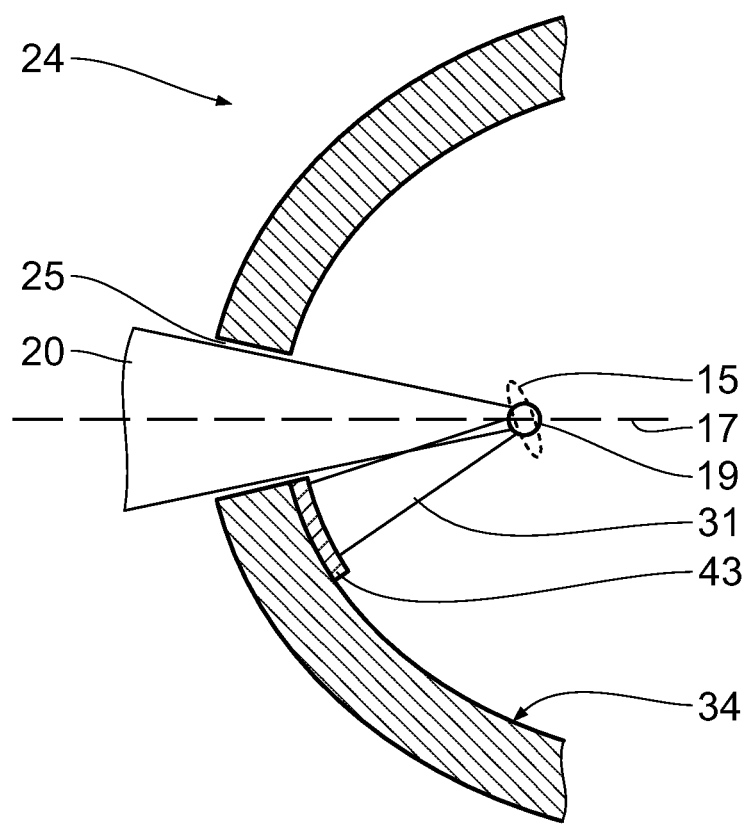
FIG. 11 shows, in an illustration similar to FIG. 10, a further embodiment of the EUV collector, including beam guiding of the pump light.

FIG. 11 shows a further embodiment of an EUV collector 24 which may be used in place of one of the variants of the EUV collector 24 described above. Components and functions corresponding to those which were used above with reference to the embodiment according to FIGS. 1 to 10 have the same reference signs and are not discussed again in detail.

In the EUV collector 24 according to FIG. 11, an extraneous light portion 43 is embodied as an absorbing portion of the overall impingement surface 34 of the EUV collector 24. From the tin droplet 15, which enters into the plasma source region 19, the pump light component 31 of the incident pump light 20 is reflected to the extraneous light portion 43 and absorbed there.

The extraneous light portion 43 may be thermally decoupled from the collector 24. Then, it is possible to dispense with complicated cooling of the collector 24. A main body of the EUV collector 24 may be manufactured from aluminium. Alternative materials for this main body are copper, alloys containing copper and/or aluminium or alloys of copper and aluminium oxide produced by powder metallurgy.

In order to produce a microstructured or nanostructured component, the projection exposure apparatus 1 is used as follows: First, the reflection mask 10 or the reticle and the substrate or the wafer 11 are provided. Subsequently, a structure on the reticle 10 is projected onto a light-sensitive layer of the wafer 11 with the aid of the projection exposure apparatus 1. Then, a microstructure or nanostructure on the wafer 11, and hence the microstructured component, is produced by developing the light-sensitive layer.

What is claimed is:

1. An EUV collector configured to guide EUV used light emitted by a plasma source region,
wherein the EUV collector is configured so that during use of the EUV collector in an EUV projection exposure apparatus:
radiation emitted by the plasma source region impinges on an overall impingement surface of the collector;
a used light portion of the overall impingement surface guides the EUV used light;
an extraneous light portion of the overall impingement surface diverts extraneous light radiation;
the extraneous light radiation has a wavelength that is different from a wavelength of the used light;
the used light portion and the extraneous light portion are not congruent;
the extraneous light portion is a diffraction grating for the extraneous light radiation;
the overall impingement surface is rotationally symmetric with respect to an axis of symmetry, or the used light portion is rotationally symmetric with respect to the axis of symmetry; and
the extraneous light portion is arranged in a non-rotationally symmetric manner with respect to the axis of symmetry.

2. The collector of claim 1, wherein the overall impingement surface is rotationally symmetric with respect to the axis of symmetry.

3. The collector of claim 1, wherein the used light portion is rotationally symmetric with respect to the axis of symmetry.

4. The collector of claim 1, wherein the extraneous light portion has an extent that is at most 50% of the used light portion of the overall impingement surface.

5. The collector of claim 1, wherein the extraneous light portion is a sub-portion of the used light portion.

6. The collector of claim 1, wherein the used light portion is configured so that the EUV used light guided therewith is not reflected more than once at the used light portion.

7. The collector of claim 1, wherein at least one region of the used light portion is configured so that the EUV used light is incident thereon with an angle of incidence of at most 45°.

8. The collector of claim 1, further comprising a pump light passage opening to pass incident pump light from a pump light source.

9. The collector of claim 1, wherein:
- the extraneous light portion is arranged in a region of a pump light impact zone of the overall impingement surface; and
- the pump light impact zone is a zone into which pump light is reflected during the operation of the EUV collector from the plasma generation material arranged in a plasma source region.

10. The collector of claim 9, wherein the extraneous light portion completely covers the pump light impact zone.

11. The collector of claim 1, wherein the overall impingement surface is rotationally symmetric with respect to the axis of symmetry, and the used light portion is rotationally symmetric with respect to the axis of symmetry.

12. The collector of claim 11, wherein the extraneous light portion has an extent that is at most 50% of the used light portion of the overall impingement surface.

13. The collector of claim 12, wherein the extraneous light portion is a sub-portion of the used light portion.

14. The collector of claim 13, wherein the used light portion is configured so that the EUV used light guided therewith is not reflected more than once at the used light portion.

15. The collector of claim 14, wherein at least one region of the used light portion is configured so that the EUV used light is incident thereon with an angle of incidence of at most 45°.

16. The collector of claim 15, further comprising a pump light passage opening to pass incident pump light from a pump light source.

17. An illumination system, comprising:
- an EUV collector according to claim 1; and
- an illumination optical unit configured to illuminate an object with the EUV used light.

18. An optical system, comprising:
- an EUV collector according to claim 1;
- an illumination optical unit configured to illuminate an object with the EUV used light; and
- a projection optical unit configured to image the object into an image field.

19. A projection exposure apparatus, comprising:
- an EUV light source;
- an EUV collector according to claim 1;
- an illumination optical unit configured to illuminate an object with the EUV used light; and
- a projection optical unit configured to image the object into an image field.

20. A method of using a projection exposure apparatus comprising an EUV light source, an EUV collector, an illumination optical unit and a projection optical unit, the method comprising:
- using the collector to provide EUV light from the EUV light source to the illumination optical unit so that the illumination optical unit illuminates a portion of a reticle in an object field; and
- using the projection optical unit to project the illuminated reticle onto an image field,
- wherein the EUV collector comprises an EUV collector according to claim 1.

* * * * *

UNITED STATES PATENT AND TRADEMARK OFFICE
CERTIFICATE OF CORRECTION

Page 1 of 1

PATENT NO. : 10,578,972 B2
APPLICATION NO. : 16/136453
DATED : March 3, 2020
INVENTOR(S) : Holger Kierey and Johannes Zellner It is certified that error appears in the above-identified patent and that said Letters Patent is hereby corrected as shown below:

In the Specification

Column 7, Line 32, delete "defracted" and insert -- diffracted --.

Signed and Sealed this
Fifth Day of May, 2020

Andrei Iancu
*Director of the United States Patent and Trademark Office*